(12) United States Patent
Douzane et al.

(10) Patent No.: US 8,447,438 B1
(45) Date of Patent: May 21, 2013

(54) REAL-TIME FLEXIBLE VEHICLE CONTROL APPARATUS

(75) Inventors: Khaled Douzane, Grasse (FR);
Stephane Le Merdy, Orphin (FR); Loic Vezier, La Roquette sur Siagne (FR);
Pascal Jullien, Vence (FR)

(73) Assignee: Scaleo Chip, Valbonne, Sophia Antipolis (FR)

( * ) Notice: Subject to any disclaimer, the term of this patent is extended or adjusted under 35 U.S.C. 154(b) by 0 days.

(21) Appl. No.: 13/306,603

(22) Filed: Nov. 29, 2011

(51) Int. Cl.
*G06F 17/00* (2006.01)

(52) U.S. Cl.
USPC .......... 701/1; 701/2; 701/16; 701/22; 701/23; 701/51; 701/53; 701/57; 701/87; 701/110; 701/114; 700/176; 700/184; 700/193; 219/69.12

(58) Field of Classification Search
USPC ............. 701/1, 2, 16, 22, 23, 51, 53, 87, 110, 701/114; 700/176, 184, 193; 219/69.12; 653/189.05
See application file for complete search history.

(56) References Cited

U.S. PATENT DOCUMENTS

| | | | |
|---|---|---|---|
| 4,023,641 A | 5/1977 | Ganoung | |
| 5,796,268 A * | 8/1998 | Kaplinsky | 326/39 |
| 5,913,910 A | 6/1999 | Ochi et al. | |
| 6,006,149 A | 12/1999 | Salecker et al. | |
| 6,188,255 B1 * | 2/2001 | Mann | 327/113 |
| 6,388,478 B1 * | 5/2002 | Mann | 327/113 |
| 6,405,116 B1 | 6/2002 | Koibuchi | |
| 6,434,472 B1 | 8/2002 | Minowa et al. | |
| 6,498,967 B1 | 12/2002 | Hopkins et al. | |
| 6,506,140 B1 | 1/2003 | O'Neil et al. | |
| 6,654,677 B2 | 11/2003 | Weber et al. | |
| 6,689,014 B2 | 2/2004 | Fleming et al. | |
| 6,738,701 B2 | 5/2004 | Wilson | |
| 6,754,578 B1 * | 6/2004 | Bidner et al. | 701/108 |
| 6,792,344 B2 | 9/2004 | Minowa et al. | |
| 6,965,816 B2 * | 11/2005 | Walker | 701/16 |
| 7,047,117 B2 | 5/2006 | Akiyama et al. | |
| 7,162,353 B2 | 1/2007 | Minowa et al. | |
| 7,328,686 B2 * | 2/2008 | Cullen | 123/325 |
| 7,337,046 B2 | 2/2008 | Minowa et al. | |
| 7,516,007 B2 | 4/2009 | Tamai et al. | |
| 7,606,649 B2 | 10/2009 | Sato | |
| 7,630,800 B2 | 12/2009 | Hirano et al. | |
| 7,676,315 B2 * | 3/2010 | Doering et al. | 701/87 |
| 7,758,467 B2 | 7/2010 | Ashizawa et al. | |
| 7,917,275 B2 * | 3/2011 | Doering et al. | 701/87 |
| 8,239,113 B2 * | 8/2012 | Doering et al. | 701/87 |

(Continued)

OTHER PUBLICATIONS

Tse et al., A Quasi-Linear Controller for DC/DC Converter Using a TMS320 Digital Signal Processor, 1994, IEEE, p. 1040-1045.*

(Continued)

*Primary Examiner* — McDieunel Marc
(74) *Attorney, Agent, or Firm* — Blakely Sokoloff Taylor & Zafman LLP

(57) ABSTRACT

An apparatus on an integrated circuit provides a real-time flexible interface between inputs from a vehicle components and outputs to the vehicle control components. The functions comprises of a programmable interconnection matrix, engine sensors and a control interface. Both engine sensors and control functions comprise of fixed hardwired functions and a customization hardware area. The apparatus therefore provides means for flexible powertrain events control target for the next generation of low-polluting power trains of vehicles.

7 Claims, 4 Drawing Sheets

U.S. PATENT DOCUMENTS

| | | | | |
|---|---|---|---|---|
| 8,285,431 | B2 * | 10/2012 | Heap et al. | 701/22 |
| 8,321,121 | B2 * | 11/2012 | Santou et al. | 701/104 |
| 2007/0213909 | A1 | 9/2007 | Doering et al. | |
| 2009/0287382 | A1 | 11/2009 | Blum et al. | |
| 2010/0280687 | A1 | 11/2010 | Tate, Jr. et al. | |

OTHER PUBLICATIONS

Smith et al., A Flexible Rapid-Prototyping System for Digital-Controlled High Power Converters, 2005, IEEE, p. 70-74.*

* cited by examiner

REAL-TIME FLEXIBLE VEHICLE CONTROL APPARATUS

BACKGROUND OF THE INVENTION

1. Field of the Invention

The invention generally relates to vehicle control and more specifically to an integrated programmable solution for electronic control of the new generation of low polluting and fuel efficient powertrain of vehicles.

2. Prior Art

At both national and international levels, states are setting legislations and standards that impose on vehicles to be either more fuel-efficient or more environmental friendly by limiting $CO_2$ and other pollutant emissions. These include, for example, EURO 6 and EC 443/2009 in Europe, CAFE (Corporate Average Fuel Economy) standard and EPA (Environment Protection Agency) regulation in US and MOE (Ministry of the Environment) emission standards in Japan. In parallel, leaders of the automotive market are working on a common frame, the ISO 26262 standard, to make electrical/electronic systems, embedded in vehicle, more reliable. In countries such as China and India such regulations, constraining car manufacturers, are emerging as well, and will increase in the coming years. In case of ratio limitations non-compliance fees are planned to stimulate manufacturers and consumers to achieve compliance. In this context, by 2014, new vehicles will have to be more environmental friendly, energy effective and safer.

To reach these objectives, automotive manufacturers and their respective suppliers are primarily focusing on improving their traditional thermal engines by introducing new technologies such as actuators electrification, motor "down-sizing", and transmission electrification or hybridization, e.g., electric motor association. Vehicles weight reduction, e.g., by wiring reduction and replacement of mechanical controls by electrical control, and predictive navigation, e.g., having the power train system taking into consideration traffic information and global positioning system (GPS) data, are additional ways for improvement. Thus the growing engine complexity trends implies simultaneously an increase of powertrain systems variants and a noticeable increase in the number of sensors and actuators and of the amount of data required to be processed concurrently in real-time resulting in an increasing latency of the electronic system and costs issues.

It would be therefore advantageous to provide a powertrain solution which addresses the currently unmet challenges that include, for example, latency and costs issues to effectively support powertrain system variants.

DETAILED DESCRIPTION OF THE PREFERRED EMBODIMENTS

An apparatus on an integrated circuit provides a real-time flexible interface between inputs from a vehicle components and outputs to the vehicle control components. The functions comprises of a programmable interconnection matrix, engine sensors and a control interface. Both engine sensors and control functions comprise of fixed hardwired functions and a customization hardware area. The apparatus therefore provides means for flexible power train events control target for the next generation of low-polluting power trains of vehicles.

Figure 1:
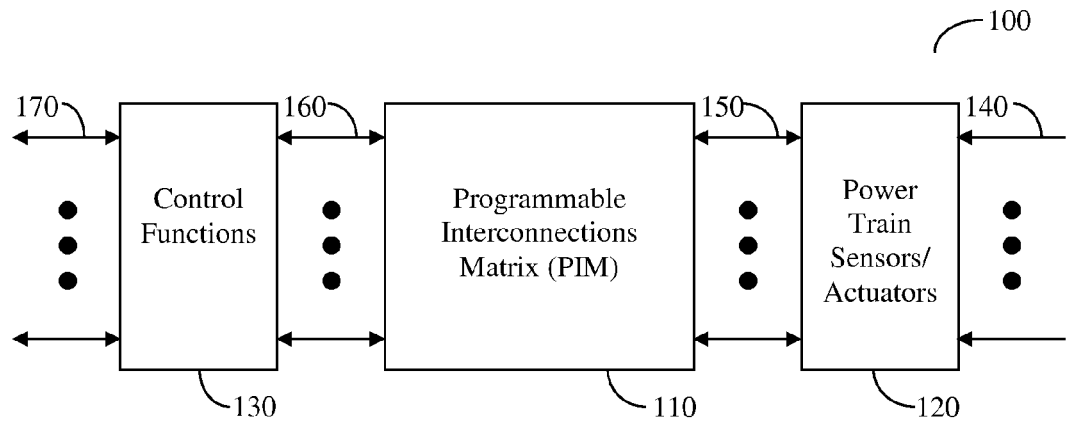
FIG. 1 is a schematic block diagram of an apparatus implemented in accordance with the principles of the invention.

FIG. 1 depicts an exemplary and non-limiting schematic block diagram of an apparatus 100 implemented in accordance with the principles of the invention. A programmable interconnections matrix (PIM) 110 is designed to allow, under the control of an appropriate controller, the configuration of the connections between sensing elements of the power train of a vehicle and the control elements that control the power train. By being able to change configurations (program or reprogram), at initialization (power on) and/or during the operation of the vehicle (run time), different functions the suit different use conditions are made possible, adapting the entire system to real-time inputs of the operation conditions of the power train of a vehicle. Configuration information may be stored in volatile or non-volatile memory or any combination thereof. The PIM 110 is connected to a plurality of power train actuators/sensors 120 that provide real-time feedback from the power train using interface 140 to the apparatus 100. Such sensors may be further controlled through PIM 110 using the connection interface 150. The sensors 120 may be hardwired or programmable as discussed in more detail herein below. Control functions 130 provides a plurality control units or interfaces that are controllable through PIM 110 and the interface 160 that connects between PIM 110 and the control functions 130. The control functions 130 control one or more elements of the power train of the vehicle over interface 170.

Figure 2:
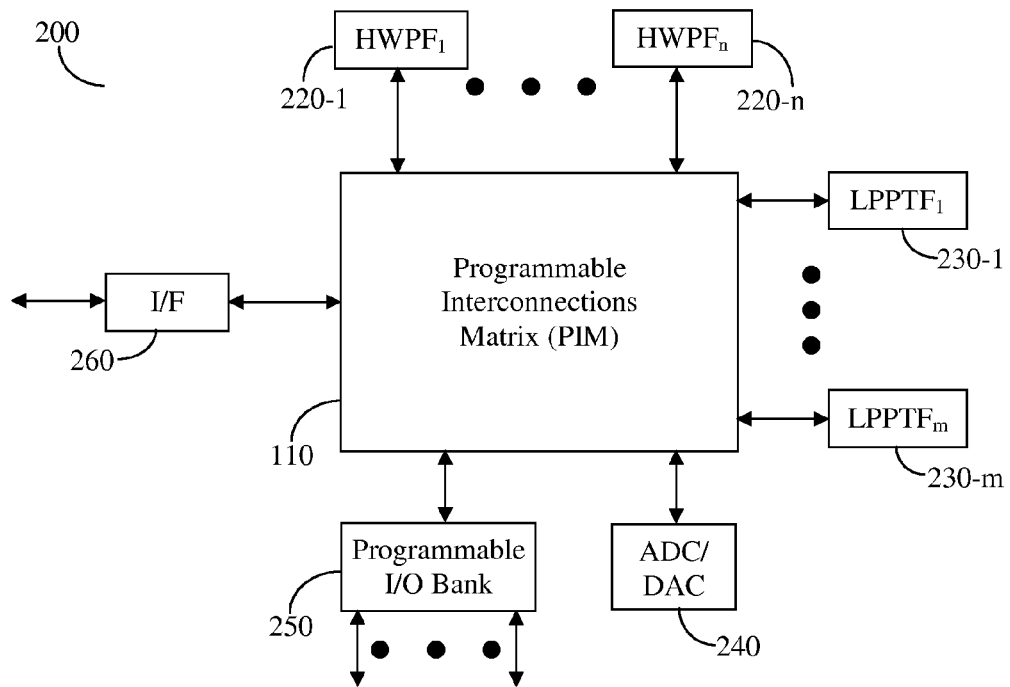
FIG. 2 is a schematic block diagram of the advanced motor event control unit of the apparatus.

FIG. 2 depicts an exemplary and non-limiting schematic block diagram of an advanced motor event control unit 200 providing additional details regarding the apparatus 100. The control unit 200 design enables the addressing of the engine control by raising performance, real-time response, high resolution, events concurrency and actuators diversity as explained in more detail below. At the core of this block is the PIM110 that allows full flexibility with the connections and handling of events as they are delivered from the point of occurrence. The control unit 200 further comprises a plurality of hardwired, or otherwise fixed, power train function (HWPF) elements 220-1 through 220-n (such as an analog to digital converter (ADC)) as well as a plurality of logical programmable power train function (LPPTF) elements 230-1 through 230-m (such as a proportional-integral-derivative computation (PID)) all communicatively connected to the PIM110. Other elements may be connected to the PIM110, for example but without limitation, an analog-to-digital converter (ADC) and digital-to-analog converter (DAC) 240, a programmable input/output (I/O) bank 250, and interface 260 to enable communication with a host computer. Such an interface 260 may allow for the programming of the programmable portions of control unit 200, where programming can be made using a high-level language that is capable of appropriately interfacing with the apparatus 200.

According to the principles of the invention, the set of HWPF elements 220 and LPPTF elements 230, used through custom combinations and connectivity using the PIM110, enable flexible implementation of power train functions. These achieve, for example and without limitation, fully concurrent processing to manage a maximum of power train event real-time support without latency bottleneck by construction suitable hardware and software partitioning which allow: critical task implementation in hardware, and implementation of performance consuming tasks in hardware in order to offload the application processors. The solution further allows high system integration by avoiding the need to bind an application specific integrated circuit (ASIC) or a field-programmable array (FPGA) to support the requirements of an advanced powertrain architecture. To support the new standards and future developments of the engines, the apparatus 200 have a high adaptability to control a wide range of sensors and actuators without increasing processor load. The programmable functions included in apparatus 200 allow this high adaptability. The ability to offload the processor from at least some of the functions reduces operating frequency as well as current consumption. Therefore, function such as, but not limited to, crankshaft target detection, camshaft target detection, complex waveform generation, pulse width modulation (PWM), multiple action timers, power train focused arithmetic units, decimation unit, and digital filters are all envisioned as part of the possible programming of the advanced motor event control unit 130, and are therefore to be considered part of the invention.

Figure 3:
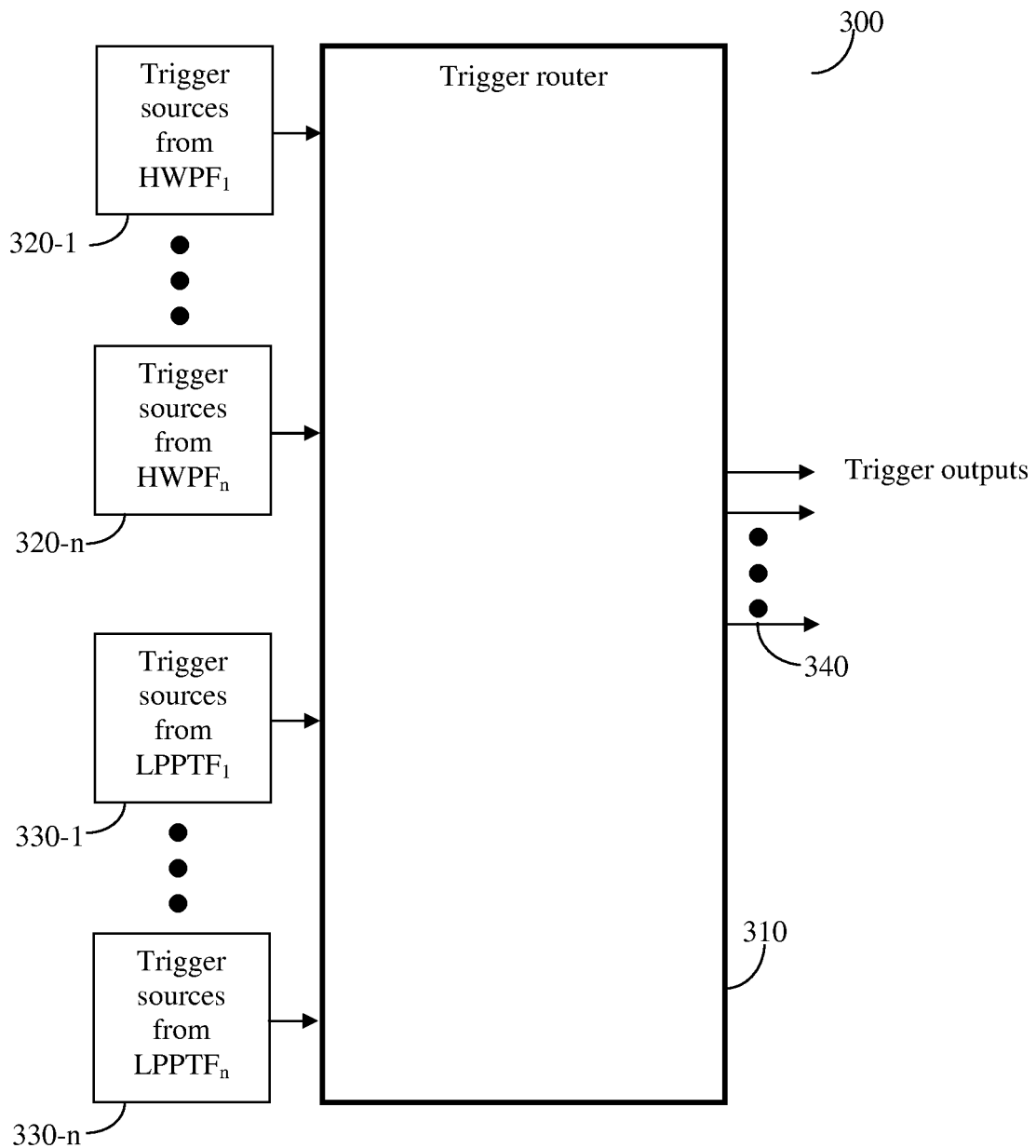
FIG. 3 is a schematic block diagram of a trigger router according to an embodiment of the invention.

FIG. 3 depicts an exemplary and non-limiting trigger management module 300. This module is a part of the apparatus (100). This module routes events from one module to another module. The number of modules as well as the type of modules can vary and should be considered to be limiting upon the scope of the invention. For example, in one non-limiting embodiment of the invention, the types of modules can be HWPF 220-1 to 220-n and/or LPPTF 230-1 to 230-n. Other external elements connectible to apparatus 100 may also be used without departing from the scope of the invention. Module 300 contributes to improvement of the global performance by reducing software overhead. For example, the module 300 enables the start of a memory transfer, using a direct memory access (DMA) module, can be triggered once an analog-to-digital converter (ADC) ends a capture by sending a trigger signal. No involvement of software is then necessary therefore reducing the software overhead.

Figure 4:
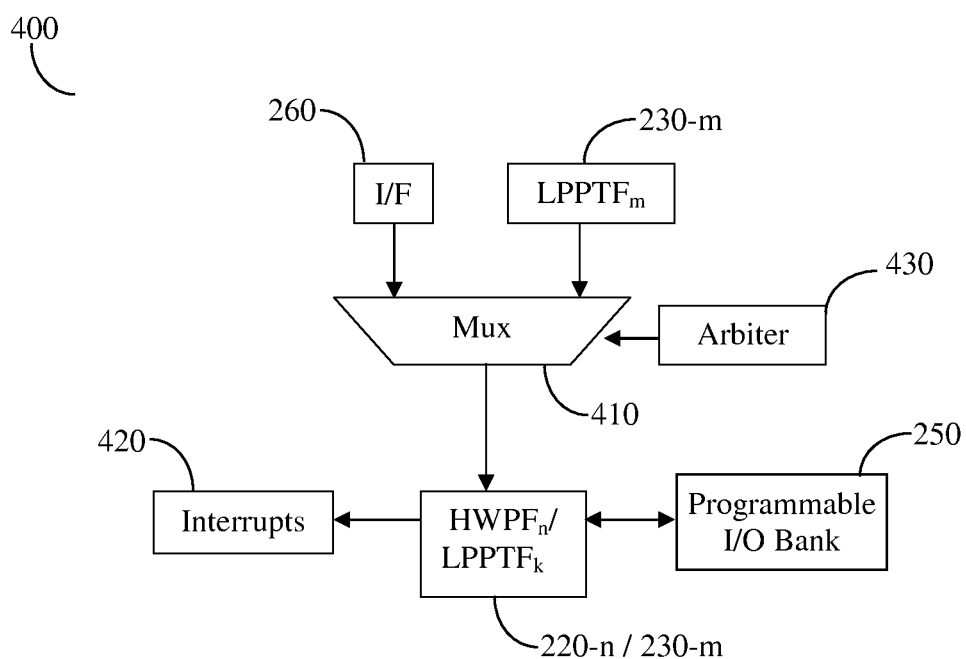
FIG. 4 is a schematic block diagram of the multiplexing mechanism once the PIM is programmed according to an embodiment of the invention.

FIG. 4 shows an exemplary and non-limiting schematic block diagram 400 of multiplexing mechanism once the PIM 110 is programmed according to an embodiment of the invention. The elements HWPF 220-1 to 220-n and/or LPPTF 230-1 to 230-m can be independently accessed by a host via interface 260 or by one or more of the elements LPPTF 230-1 to 230-m. This exemplary embodiment is made possible by using a multiplexer (mux) 410 with an arbiter 430. This embodiment provides flexibility to the software in accessing hardware elements. For example, an ADC module can be accessed directly by the apparatus 100 via a LPPTF element (case A) or by the host CPU (case B) via the interface 260. In exemplary case A data is exploited to maintain engine control in nominal behavior. In exemplary case B, and during the nominal engine control described in case A, host CPU can interpret data to allow fuel-efficient control by injecting a new control rule to apparatus 100. Moreover, the same hardware environment is available in case A and in case B examples of usage; thus and in the same way, interrupts can occur via interrupt controller 420 and I/O units can be accessed via the programmable I/O bank 250. In case of simultaneous access from I/F 260 and LPPTFm 230-m, an arbiter 430 define the priority.

Figure 5:
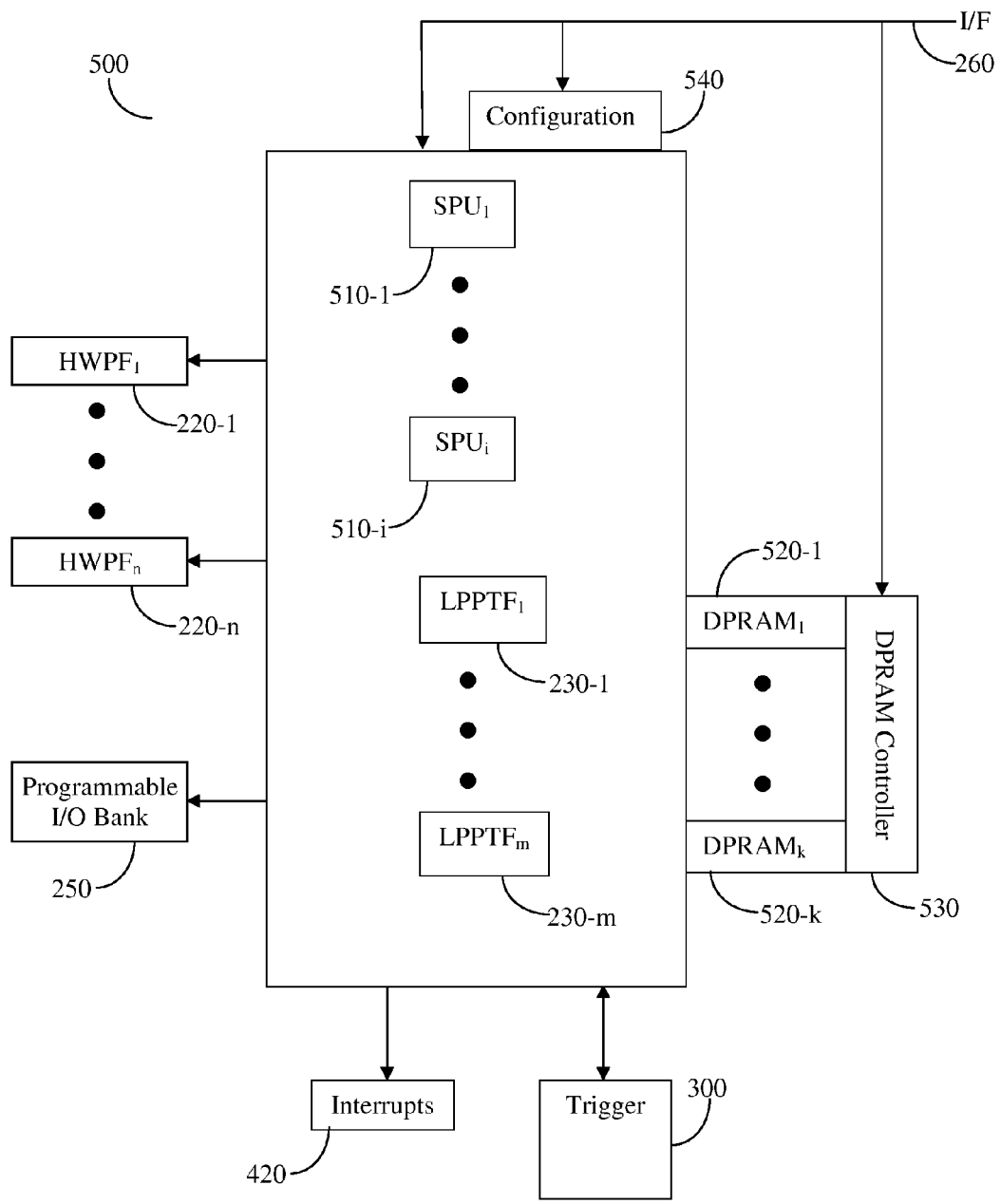
FIG. 5 is a schematic block diagram of detailed implementation of the apparatus.

FIG. 5 depicts an exemplary ad non-limiting block diagram 500 of an implementation of the apparatus 100. The apparatus comprises of LPPTFs 230-1 to 230-m and signal processing units (SPUs) 510-1 to 510-i. These hardware elements embed arithmetic modules to provision operations such as, but not limited to, multiplication and adding operations. By implementing such as operational modules, the count of electronic gates can be optimized. Thus, the number of LPPTFs can be increased to allow a better modularity. The apparatus may further include dual-port random access memories (DPRAMs) 520-1 to 520-k. Such DPRAMs 520 allow for a working area between the apparatus 100 and a host CPU via interface 260. The apparatus 100 shown in block diagram 500 and the host CPU can have simultaneous access to the DPRAMs 520. The DPRAMs 520 may contain raw data generated by the LPPTF (230-1 to 230-m) that can be read and processed by the host CPU to provide new and optimized data. This new and optimized data is then stored in the DPRAMs 520 and used by apparatus 100 to permit optimized engine control. Because the apparatus 100 shown in block diagram 500 is fully programmable, it embeds a configuration interface 540. This configuration interface 540 receives configuration elements and programs the LPPTFs to operate at a predetermined manner. The exemplary apparatus 100 shown in block diagram 500 is further connected to a trigger module 300, HWPFs 220-1 to 220-n, and I/O elements connected through the I/O programmable bank 250. It can further generate interrupts via the interrupt controller 420.

While the disclosed invention is described hereinabove with respect to specific exemplary embodiments it is noted that other implementations are possible that provide the advantages described hereinabove, and which do not depart from the spirit of the inventions disclosed herein. Such embodiments are specifically included as part of this invention disclosure which should be limited only by the scope of its claims. Furthermore, the apparatus disclosed in the invention may be implemented as a semiconductor device on a monolithic semiconductor. The apparatus disclosed in the invention may be implemented, in one non-limiting embodiment, as a semiconductor module as part of a System-On-Chip (SoC) semiconductor device on a monolithic semiconductor. Other embodiments of the apparatus may be also implemented without departing from the scope of the disclosed invention.

What is claimed is:

1. An apparatus for controlling a power train comprising:
a programmable interconnections matrix (PIM);
a plurality of power train sensors or power train actuators connected to the PIM;
a plurality of control functions connected to the PIM, each control function controlling at least a power train function;
a dual-port random access memory having direct memory access to control power train functions or programmable control functions by a central processing unit;
a dual-port random access memory having direct memory access to share data between a central processing unit and a programmable function;
wherein the PIM enables real-time programmable connection of the plurality of at least power train sensors or at least power train actuators to the plurality of control functions.

2. The apparatus of claim 1, wherein the sensors or actuators comprises at least one of: a programmable sensor, a programmable actuator, a hardwired sensor, a hardwired actuator.

3. The apparatus of claim 1, wherein the plurality of control functions comprises at least one of: a programmable control function, a hardwired control function.

4. The apparatus of claim 1, wherein the apparatus further comprises at least one of: a programmable input/output (I/O) bank, an analog-to-digital converter (ADC), a digital-to-analog converter (DAC).

5. The apparatus of claim 1, wherein the PIM is programmable in at least one of: power on, run-time.

6. The apparatus of claim 1, wherein the programmable PIM is programmed from one of: volatile memory, non-volatile memory.

7. The apparatus of claim 1, wherein programmable PIM is able to multiplex triggers from the plurality of power train sensors or power train actuators connected to the PIM.

\* \* \* \* \*